US010951503B1

(12) United States Patent
Chen et al.

(10) Patent No.: US 10,951,503 B1
(45) Date of Patent: Mar. 16, 2021

(54) DETERMINING THE VALIDITY OF DATA COLLECTED BY EXPERIMENTS PERFORMED AT A NETWORK ACCESSIBLE SITE

(71) Applicant: Amazon Technologies, Inc., Seattle, WA (US)

(72) Inventors: Rui Chen, Bellevue, WA (US); Siwei Jia, Bellevue, WA (US); Tae Yeon Kim, Seattle, WA (US); Mengyun Lv, Seattle, WA (US); Serguei B. Stepaniants, Redmond, WA (US)

(73) Assignee: Amazon Technologies, Inc., Seattle, WA (US)

( * ) Notice: Subject to any disclaimer, the term of this patent is extended or adjusted under 35 U.S.C. 154(b) by 278 days.

(21) Appl. No.: 15/494,328

(22) Filed: Apr. 21, 2017

(51) Int. Cl.
*G06F 9/44* (2018.01)
*G06Q 30/02* (2012.01)
*H04L 29/08* (2006.01)
*H04L 12/26* (2006.01)
*H04L 12/24* (2006.01)
*G06F 11/36* (2006.01)
*G06F 30/20* (2020.01)
*G05B 23/02* (2006.01)

(52) U.S. Cl.
CPC .......... *H04L 43/0876* (2013.01); *H04L 41/14* (2013.01); *G05B 23/0254* (2013.01); *G06F 11/3668* (2013.01); *G06F 11/3688* (2013.01); *G06F 30/20* (2020.01)

(58) Field of Classification Search
None
See application file for complete search history.

(56) References Cited

U.S. PATENT DOCUMENTS

| 6,934,748 | B1 | 8/2005 | Louviere et al. |
| 7,292,531 | B1 | 11/2007 | Hill |
| 9,692,674 | B1 | 6/2017 | Zhang et al. |
| 2002/0161755 | A1 | 10/2002 | Moriarty |
| 2007/0058631 | A1 | 3/2007 | Mortier et al. |
| 2007/0192078 | A1* | 8/2007 | Nasle .................. G05B 23/0254 703/14 |
| 2008/0175150 | A1 | 7/2008 | Bolt et al. |
| 2008/0282233 | A1* | 11/2008 | Sheppard ............ G06F 11/3688 717/127 |
| 2010/0100419 | A1 | 4/2010 | Natoli et al. |

(Continued)

OTHER PUBLICATIONS

Office Action for U.S. Appl. No. 15/406,282, dated Feb. 13, 2020, Muralidharan, "Computationally and Network Bandwidth-Efficient Technique to Determine Network-Accessible Content Changes Based on Computed Models", 30 Pages.

*Primary Examiner* — Nicholas R Taylor
*Assistant Examiner* — Ho T Shiu
(74) *Attorney, Agent, or Firm* — Lee & Hayes, P.C.

(57) ABSTRACT

Technologies are disclosed for determining validity of data obtained from an A/B experiment, where the experiment evaluates the desirability of a potential change at a website. The experiment is run for a period of time and based upon an expected allocation of users into the A group (control group) and the B group (e.g., treatment group), along with an actual number of users directed into the two groups, it is determined if a minimal detectable error of allocation has been exceeded and, if it has, the data is deemed to be invalid. If not, the data is deemed to be valid.

20 Claims, 7 Drawing Sheets

(56) References Cited

U.S. PATENT DOCUMENTS

| | | |
|---|---|---|
| 2012/0120798 A1 | 5/2012 | Jacquet et al. |
| 2013/0030868 A1* | 1/2013 | Lyon ................. G06Q 30/0236 705/7.33 |
| 2013/0046724 A1* | 2/2013 | Zhao ....................... G06N 5/02 706/52 |
| 2013/0080134 A1* | 3/2013 | Donovan ............... G06N 7/005 703/11 |
| 2013/0218818 A1 | 8/2013 | Phillips |
| 2014/0180961 A1 | 6/2014 | Hankins et al. |
| 2014/0237595 A1 | 8/2014 | Sridhara et al. |
| 2015/0109979 A1 | 4/2015 | Miklos et al. |
| 2016/0261482 A1 | 9/2016 | Mixer et al. |
| 2016/0344754 A1 | 11/2016 | Rayapeta et al. |
| 2017/0103334 A1 | 4/2017 | Gusev et al. |
| 2018/0091609 A1* | 3/2018 | Xu ......................... H04L 67/22 |

\* cited by examiner

DETERMINING THE VALIDITY OF DATA COLLECTED BY EXPERIMENTS PERFORMED AT A NETWORK ACCESSIBLE SITE

BACKGROUND

Network accessible sites offer users a variety of experiences. For example, users may access such sites over a network such as, for example, websites accessed over the Internet, in order to view media, play games, purchase goods and/or services, access information, provide information, etc. Operators of such websites may wish to know the effect various changes to the website may have on user behavior. For example, operators of network accessible sites may wish to know what effect moving a graphical user interface (GUI) displayed on the site has on user behavior.

In order to predict what effect changes at a network accessible site may have on user behavior, operators may run experiments. For example, an experiment might be to move a GUI at a website. In order to determine the effect such a change may have, the experiment may be run as what is referred to as an A/B experiment where two groups are randomly established. A first group may be a control group, where the location of the GUI remains unchanged. A second group may be a treatment group, where the location of the GUI at the website is changed, for example, moved up on a page at the site. The operator of the site running the experiment may wish to know if the change in location of the GUI affects how much users interact with the GUI at the website.

Thus, the operator runs the experiment and at the end of the experiment compares the results from the two groups. However, in order to determine a length of time for running the experiment, historical data is generally used to determine the length of time, thereby delaying the start of the experiment. Additionally, in order to obtain enough data for there to be a statistically significant difference between the two groups, the length of time for running the experiment, based upon historical data, may be determined to be three months, six months or even a year, thereby requiring large amounts of processor cycles, computing resources, power.

Finally, in order for data collected by experiments such as those described above to be meaningful, "false negatives" with respect to usability of data obtained from experiments must be avoided, especially if the random assignment of users to the control group and the treatment group is handled as desired. Such false negatives cause an experiment to be needlessly run again, thereby delaying obtaining results of the experiment and requiring additional processor cycles, computing resources, power. These potential problems can create a burden for the operator of the website who may wish to know the effect of the potential change much sooner in order to implement the change in a timely manner and/or who may run an experiment that is believed to have unusable data, when the data is in fact usable.

The disclosure made herein is presented with respect to these and other considerations.

DETAILED DESCRIPTION

Figure 1:
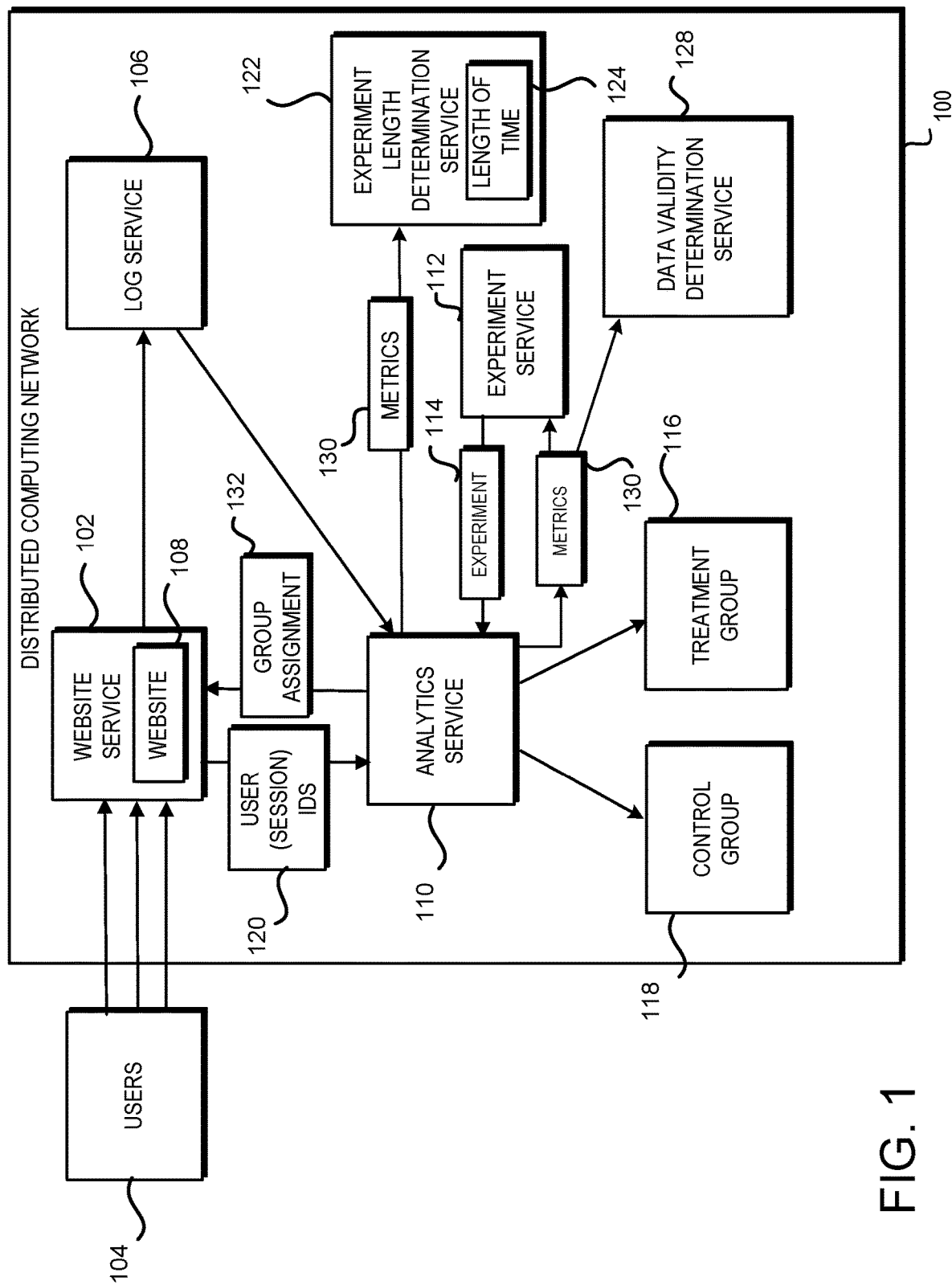
FIG. 1 schematically illustrates a distributed computing network that provides various services including a website service, as well as an experiment length determination service and a data validity determination service for experiments run at a website provided by the website service, according to one configuration.

The following detailed description is directed to technologies for determining how long to run an experiment related to a potential change at a network accessible site. The following detailed description is also directed to technologies for determining whether an alarm should be generated for experiments due to various problems, including improper randomization of users assigned to a control group and a treatment group. An implementation of the technologies described herein can improve the speed with which changes may be made to network accessible sites such as, for example, websites accessible over the Internet. Furthermore, experiments may be run for shorter amounts of time thereby saving processor cycles, computing resources, power, etc.

Traditional experimental systems (A/B experimental systems) use changes in metrics observed during the course of an experiment related to a potential change at a network accessible site to evaluate whether the experiment was successful. The impact of the experiment is also evaluated and recommendations may be made for launching the potential change permanently. However, the impact of an experiment may not be statistically meaningful if the experiment does not run for a sufficient amount of time. This may result in an under-powered experiment due to a lack of sample size.

For example, assume the effect of an experiment needs to have at least 3 weeks of data to be detectable statistically, i.e., the detected results provide differences that are statistically significant. The existing methods of estimating a runtime for an experiment often provide an inaccurate estimate because the estimation is based upon data that is not specific to the particular experiment. Running an experiment for a period of time that is longer or shorter than is necessary results in a waste of resources, e.g., processing time, network bandwidth, storage, services to correlate and analyze the data, etc., and slows down the pace of innovation.

By utilizing a power equation and utilizing short term data obtained from initially running an experiment, it can be determined how long an experiment should run, or if it should run at all, before results of the experiment will become statistically significant. The power equation can use short run experiment data (e.g., 1 week) to determine how long to run the experiment to obtain a desired level of power, e.g., a measure of accuracy without using historical data.

Additionally, mechanisms are disclosed where a minimal detectable difference is calculated that takes into account a false positive rate and a false negative rate. The minimal detectable difference may be utilized to determine when data obtained in experiments such as those described above may be unusable, and if an alarm or flag should be provided to the user running the experiment.

Thus, experiments may begin immediately, and based upon initial data from the experiments, the length of time for the experiments may be determined. The experiments generally do not need to run as long as when previous solutions are utilized, thereby saving processor cycles, computing resources, power, etc. Furthermore, false negatives with regard to validity and usability of data from experiments may be reduced, thereby further saving processor cycles, computing resources, network bandwidth, power, etc. Technical benefits other than those specifically identified herein might also be realized through an implementation of the disclosed technologies.

In configurations, an operator of a website or another type of information site may wish to know the effect on user behavior or network activity when the location of a graphic user interface (GUI) is moved up on a page of the website (e.g., users see the GUI sooner upon accessing the page). Thus, an experiment may be developed for checking the effect that moving the GUI has on user behavior. Generally, the experiment includes randomly assigning users that access the site, e.g., directing traffic at the site, to either a control group where the location of the GUI is unchanged, or to a treatment group where the location of the GUI is changed. The randomization may be based upon user identity or may be based upon session identity, which is a proxy of users.

In configurations, once the experiment has been developed, the experiment begins without taking into account prior historical data with respect to user behavior. As users "trigger" into the experiment (e.g., users access the site and are assigned to one of the groups), the site is displayed to the users based upon which group they have been assigned to. Users assigned to the control group will see the site displayed in its original, unchanged form (e.g., the location of the GUI is unchanged). Users assigned to the treatment group will see the site displayed where the location of the GUI is changed (e.g., moved up). Actions of the users are monitored and logged by a log service, which provides the user data, e.g., interaction data, to an analytics service that is running the experiment.

After a predetermined amount of time, for example, one week, the analytics related to user behavior during the experiment may be provided, and a power equation may be solved by an experiment length determination service to determine how long to run the experiment. In configurations, the power equation may be solved iteratively until a condition is satisfied. In some configurations, the condition may not be able to be satisfied and the experiment may be discontinued.

Once the experiment is completed, the data may be analyzed by a data validity determination service to help minimize the likelihood of a false negative with regard to the randomness of user assignments to the control group and the treatment group. Also, the data may be analyzed to determine if the data provides a difference in user behavior between the control group and the treatment group.

If the difference in the behavior of users assigned to the control group and the treatment group is deemed to be statistically significant, then it may be determined whether the changing of the location of the GUI is desirable, undesirable or neutral, depending upon the results. If it is desirable, then the change may be instituted and an expected contribution or behavior of users based upon the change in location of the GUI may be determined. If the change is undesirable, then the change in location of the GUI may be disregarded and not instituted. Additional details regarding the various components and processes described above for determining an experiment length runtime for experiments run at a network accessible site and determining validity of data obtained from the experiments will be presented below with regard to FIGS. 1-7.

It should be appreciated that the subject matter presented herein can be implemented as a computer process, a computer-controlled apparatus, a computing system, or an article of manufacture, such as a computer-readable storage medium. While the subject matter described herein is presented in the general context of program modules that execute on one or more computing devices, those skilled in the art will recognize that other implementations can be performed in combination with other types of program modules. Generally, program modules include routines, programs, components, data structures, and other types of structures that perform particular tasks or implement particular abstract data types.

Those skilled in the art will also appreciate that aspects of the subject matter described herein can be practiced on or in conjunction with other computer system configurations beyond those described herein, including multiprocessor systems, microprocessor-based or programmable electronic devices, minicomputers, mainframe computers, handheld computers, personal digital assistants, e-readers, cellular telephone devices, special-purposed hardware devices, network appliances, and the like. The configurations described herein can also be practiced in distributed computing environments, where tasks can be performed by remote computing devices that are linked through a communications network. In a distributed computing environment, program modules can be located in and executed from both local and remote memory storage devices.

In the following detailed description, references are made to the accompanying drawings that form a part hereof, and that show, by way of illustration, specific configurations or examples. The drawings herein are not drawn to scale. Like numerals represent like elements throughout the several figures (which might be referred to herein as a "FIG." or "FIGS.").

FIG. 1 schematically illustrates a distributed computing network 100 that hosts various services including a website service 102 that provides websites that may be accessed by various users 104 over a network, e.g., the Internet. A log service 106 may also be provided by the distributed computing network 100 that may log various actions of users 104 that access a website 108 provided by the website service 102. For example, the log service 106 may log and store data related to the identity of users 104 that access the website 108, the time and day that the users 104 access the website 108, purchases, subscription purchases, return purchases, cancelled subscriptions, media streaming activity, etc.

In configurations, users generally consent to monitoring of their activities for logging and storing data. The log service 106 may provide the data to an analytics service 110, which may analyze the data for various purposes and generate metrics 130. While the present disclosure is being discussed with respect to websites 108, as previously noted, other sites that are accessible by a network may be used with the techniques and architecture described herein and the term website, as used herein, is meant to encompass such sites.

In configurations, the distributed computing network 100 also includes an experiment service 112. The experiment service 112 may provide various experiments for execution at the website 108 provided by the website service 102 in order to determine the effect of possible changes to the website 108 on the behavior of the users 104. For example, the experiment service 112 may implement an experiment 114 to determine the effect of moving the location of a graphic user interface (GUI) in the form of a "Purchase" button on a page of the website 108 on users' purchase behavior. The experiment 114 may be designed to determine the effect of moving the GUI closer to the top of the page at the website 108.

The experiment service 112 may provide the data related to the definition and implementation of the experiment 114 to the analytics service 110. The analytics service 110 may then interact with the website service 102 to change the location of the GUI at the website 108 for users 104 that are assigned to a treatment group 116. For the experiment 114, the location of the GUI will remain unchanged for a control group 118 of users 104. As users 104 access the website 108, they are randomly assigned to either the control group 118 or the treatment group 116. An example of a split between users 104 assigned to the control group 118 and users 104 assigned to the treatment group 116 is a 50-50 split. Other splits may be utilized if desired. The random assignment may be based upon user identity or may be based upon session identity, which is a proxy of users. In configurations, the assignment may not be random but may be based upon some type of criteria.

Thus, as a user 104 accesses, via a computing device, the website 108 at the website service 102, a user identifier (ID) (or session ID) 120 is provided to the analytics service 110, which then assigns or allocates the user 104 to either the control group 118 or the treatment group 116 utilizing the user ID 120. Users 104 may be identified, for example, after they have provided credentials, such as a user name and password. In other configurations, users 104 may be identified based upon various other metrics, such as, for example, persistent state objects (e.g. "cookies" received from a user's web browser, device IDs, actions performed using a client device, etc. Based upon the group assignment 132, the analytics service 110 controls the location of the GUI displayed to the user 104 by the website 108.

In configurations, an experiment length determination service 122 executes within the distributed computing network 100. As will be discussed further herein, the experiment length determination service 122 is a network service that determines a length of time 124 for running the experiment 114 based upon metrics 130 provided by the analytics service 110 obtained by running the experiment 114 for an initial period of time. In configurations, the initial amount of time is based upon a minimum amount of time to obtain results from running the experiment 114. In configurations, the minimum amount of time is approximately one week. For example, based upon initial metrics 130 provided by the analytics service 130, the experiment length determination service 122 may determine that the experiment 114 should run for a total of one month (including the initial period of time) in order to observe any statistical significance between the behavior of users in the control group 118 and the behavior of users in the treatment group 116. In configurations, the initial period of time may be one week, although other amounts of time may be used if desired. In configurations, only some of the week's worth of data, e.g., two days' worth of data, may be used by the experiment length determination service 122.

In some situations, the experiment length determination service 122 may determine that the experiment should be discontinued. Additionally, in configurations, a party requesting the experiment 114 may decide to terminate the experiment regardless of what the experiment length determination service 122 determines.

The distributed computing network 100 may also include a data validity determination service 128. As will be discussed further herein, the data validity determination service 128 is a network service configured to utilize expected and actual metrics 130, e.g., metrics related to the number of users randomly assigned to the control group 118 and the treatment group 116, to help minimize the likelihood of a false negative with regard to the proportion and/or randomness of user assignments to the control group 118 and the treatment group 116. False negative in this situation generally refers to a situation where the randomness of user assignments is deemed to be incorrect or inaccurate when in reality, the randomness of user assignments is actually correct or accurate.

Once the experiment 114 is complete, metrics 130 may be analyzed with respect to the behavior of users in the control group 118 and users in the treatment group 116. In configurations, the metrics 130 relate to the expected contribution, e.g., expected purchases, of users at the website 108. If the differences between the behavior of the users assigned to the treatment group 116 and users assigned to the control group 118 are statistically significant and/or a confidence or accuracy factor is acceptable, then the change in location of the GUI may be implemented at the website 108.

Thus, instead of running the experiment for a long period of time, e.g., a year to determine an initial effect of a change in location of a GUI, the expected effect of the GUI location change on user behavior at the website 108 may be determined in a much shorter period of time, e.g., a few weeks. By utilizing data from running the experiment 114 an initial amount of time, the experiment may begin immediately without the need to analyze historical data to determine a runtime for the experiment 114. Generally, this results in a much shorter runtime for the experiment 114. Furthermore, by determining the validity of the data gathered by the experiment 114, fewer false negatives may be realized, thereby not wasting data that is valid. Thus, the experiments 114 do not need to run as long or needlessly be re-run, thereby saving processor cycles, power, network bandwidth, storage, etc.

Figure 2:
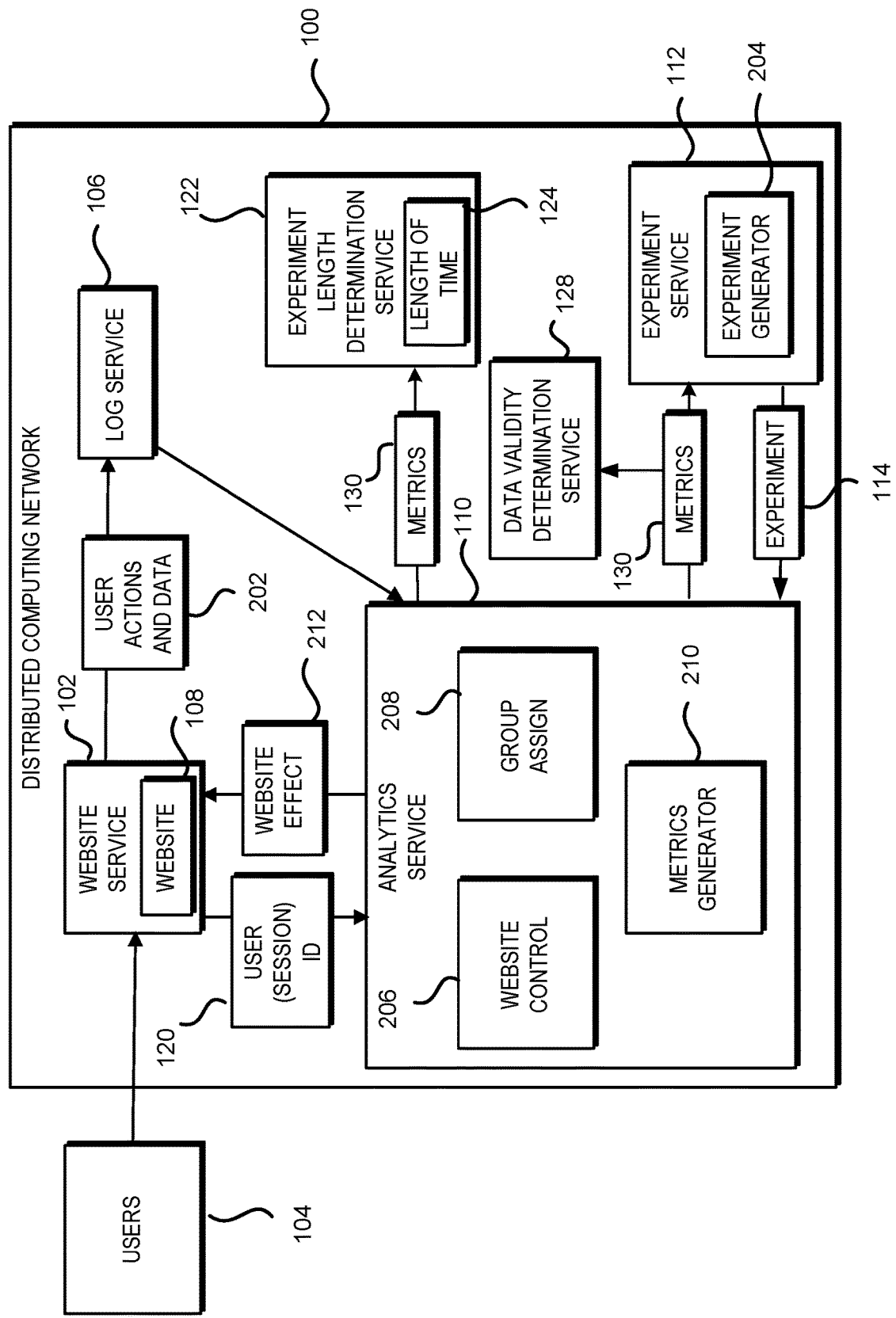
FIG. 2 schematically illustrates aspects of the configuration and operation of the analytics service and an experiment service operating within the distributed computing network of FIG. 1, according to one configuration.

FIG. 2 schematically illustrates the operation of some of the services illustrated in FIG. 1 in more detail. As may be seen, users 104 access the website 108 at the website service 102. User actions and data 202 are logged to the log service 106. User actions and data 202 may include, for example, the identity of users 104 that access the website 108, the time and day that the users 104 access the website 106, purchases, subscription purchases, return purchases, cancelled subscriptions, media streaming activity, time spent at the website 108, interactions with UIs, etc. The log service 106 may provide data related to the user actions and data 202 to the analytics service 110.

The experiment service 112 includes an experiment generator 204 that may be utilized to generate experiments for the website 108 at the website service 102 in order to determine the effects potential changes at the website 108 may have on user behavior. The experiment generator 204 can be a network service configured to generate data related to the definition and implementation of the experiment 114 at the website 108 and provides data describing the experiment 114 to the analytics service 110. For example, an experiment may be developed to determine the effect doubling of font size at the website 108 has on user behavior or an experiment may be developed to determine the effect of changing the location of a GUI at the website 108 has on user behavior.

The analytics service 110 includes a website control function 206 and a group assign function 208. As users 104 access the website 108, the users 104 are assigned or allocated to either the control group 118 by the group assign function 208 (which may also be referred to as an allocation service), where the location of a GUI, e.g., a purchase button, at the website 108 will remain unchanged by the website control function 206 via a website effect 212, or to the treatment group 116, where the location of the GUI at the website 108 will be changed by the website control function 206 via a website effect 212 that modifies code at the website 108 for users 104 in the treatment group 116. The identity 120 of the users 104 accessing the website 108 are provided to the analytics service 110 for random assignment to the two groups, 116, 118.

Based upon user actions and data 202 provided by the log service, a metrics generator 210 at the analytics service 110 may provide metrics 130 to the experiment service 112 for the control group 118 and the treatment group 116. Such metrics may include, for example, time spent by users 104 at the website 108, purchases made by users 104 at the website 108, subscriptions purchased by users 104 at the website 108, content consumed, content viewed, content viewed and dismissed, etc. Thus, the experiment service 112 can observe the difference in such metrics between the control group 118 and the treatment group 116. Data identifying the differences between the various metrics can be provided to a user who requested the experiment 114.

Based upon initial metrics (e.g., initial metrics 130 obtained from running the experiment 114 for an initial period of time such as, for example, one week), the experiment length determination service 122 may determine a total length of time 124 to run the experiment 114 independent of historical data and/or historical metrics. In configurations, the total length of time 124 may be selected to satisfy some type of criteria. In configurations, the experiment length determination service 122 may utilize statistical hypothesis testing, which often requires a trade-off among the size of the experiment 114, the resolution of the experiment 114, the power of the experiment 114, and the sample size of the experiment 114.

In configurations, the size of the experiment (generally referred to as the "size"), $\alpha$, refers to the probability that the experiment rejects a null hypothesis, given that the null hypothesis is true. This is essentially the false positive rate under the null hypothesis. Often it is desirable to control the size to be below 0.05 (e.g., 5%).

The resolution of the experiment 114 generally refers to how sensitive the experiment 114 is and may be designated as E. A more sensitive experiment 114 is generally able to pick up weaker signals, i.e. changes between the behavior of the control group 118 and the behavior of the treatment group 116. In terms of an alternative hypothesis, a sensitive experiment 114 will be able to detect the alternative hypothesis even when the alternative is close to the null hypothesis.

Often, the resolution of an experiment 114 is formulated as a percentage difference on top of the control mean to be detected. For example, for a control mean $\mu_C$, (mean of control group 118) the null hypothesis is that $\mu_T - \mu_C = 0$, where $\mu_T$ is the mean of the treatment group 116, and the alternative hypothesis is that $\mu_T - \mu_C = \varepsilon \cdot \mu_C$, where $\varepsilon$ is often used to describe the resolution (or the sensitivity level) of the experiment 114 when it is said the experiment 114 is as sensitive as being able to detect $\varepsilon \cdot 100\%$ difference from the control mean.

In configurations, the power of the experiment 114 refers to, given that the alternative hypothesis ($\mu_T - \mu_C = \varepsilon \cdot \mu_C$) is true, the probability that the experiment 114 rejects the null ($\mu_T - \mu C = 0$). The power of the experiment 114 is often denoted as $1-\beta$, where $\beta$ is the probability of a Type II error (e.g., fail to reject the null hypothesis when the alternative is true).

A common confusion is that the power can be arbitrarily high when setting the alternative very much apart from the null. Note that for any alternative, when the experiment 114 turns out to be rejecting the null, the power, which is a probability, is already turning into a realization, and therefore meaningless.

When there is not enough evidence to reject the null hypothesis, the question may be how likely "accepting" the null hypothesis is indeed a mistake. To mitigate such risk, the sample size can be increased to reduce uncertainty, not by setting a distant alternative. The sample size of the experiment 114 is the number of experimental units (e.g., users 104) included in the experiment 114 sample from which the statistical inference is made.

For an equal split of treatment group 116 assignment and/control group 118 assignment (balanced experiment), half of the N experimental units (e.g., users 104) are randomly put into the treatment group 116 and the other half into the control group 118. A larger sample size of users 104 generally leads to a more precise statistical inference.

In configurations, for a (balanced) two sample experiment 114, it can be shown that the following equation [1]

$$N^* = \frac{2}{\varepsilon^2}(Z_\alpha + Z_{1-\beta})^2 \left(\frac{\sigma}{\mu_C}\right)^2 \quad [1]$$

prescribes the relationship among the size ($\alpha$), the power ($1-\beta$), the resolution (decided by $\varepsilon$), and the minimum required sample size (N*). If the actual sample size of users 104 is larger than N*, then the experiment size, power, and resolution are all achieved at the same time. Otherwise, a trade-off needs to be made among the experiment size, power, resolution, or to increase the sample size N*.

In equation [1], $\alpha$, $1-\beta$, and $\varepsilon$ are predetermined by the user requesting the experiment 114, while $\mu_C$ and $\sigma$ are decided by the initial data. For a general one-sided experiment 114 with $\alpha=0.05$ and $$1 - \beta = 0.8, \frac{2}{\varepsilon^2}(Z_\alpha + Z_{1-\beta})^2$$

is equal to 494,605 for $\varepsilon=0.5\%$. In general, $$N^* \sim \frac{1}{\varepsilon^2}$$

when other parameters are holding fairly constant.

In terms of how long an experiment 114 should be run in order to reach a desired power for a given resolution, it can be written:

$$N = N(t);\quad [2]$$

$$k = \frac{2}{\varepsilon^2}(Z_\alpha + Z_{1-\beta})^2;\quad [3]$$

$$\left(\frac{\sigma}{\mu_C}\right)^2 = \frac{\sigma_C^2(t) + \sigma_C^2(t)}{\mu_C^2(t)} = CV(t).\quad [4]$$

Thus the question becomes finding t such that:

$$N(t) \geq k \cdot CV(t).\quad [5]$$

In configurations, N(t) can be largely linear with respect to t, and CV(t) converges to a constant rather quickly (usually within a week), which makes estimation oft relatively easy for equation [5].

In configurations, the sample size requirement calculation involves estimation of the increasing rate of N(t) and CV(t), which depends on the nature of an experiment 114. In configurations, there is a possibility that equation [5] can never be achieved for some given k, where k is the estimated slope.

The power calculation with 80% power and a false positive rate of 0.05 satisfies the following equation [6]:

$$\delta\mu_C(w) = (1.96 + 0.845)\sqrt{\frac{\sigma_C^2(w)}{N_C(w)} + \frac{\sigma_T^2(w)}{N_T(w)}}\quad [6]$$

from which it can be derived that $$\delta = (1.96 + 0.845)\sqrt{\frac{CV_C^2(w)}{N_C(w)} + \frac{CV_T^2(w)}{N_T(w)}(1+\delta)^2}\quad [7]$$

where:
- 1.96 and 0.845 are known standard constants for $\alpha=0.05$ and $1-\beta=0.8$;
- $\delta$ is the minimal detectable lift size, where lift size refers to a detectable difference between the control group and treatment group;
- N(w) is the unique session count by the treatment group at week w; and
- $CV(w) = \sigma(w)/\mu(w)$ is the Coefficient of variation of the metric under study at week w.

In configurations, the experiment length determination service 122 utilizes initial metrics 130 from running the experiment, e.g. the first week of metrics 130 (although other initial lengths of time may be used), to extrapolate the values of N(w) and CV(w) at the future week so that the experimental runtime schedule for experiment 114 can be estimated.

It has been determined that $$\frac{CV^2(w)}{N(w)}$$

is approximately a power-law function, i.e.

$$\frac{CV^2(w)}{N(w)} = aw^k.$$

This is because it has been determined that $$\log\frac{CV^2(w)}{N(w)}$$

is approximately linear to log w, i.e.

$$\log\frac{CV^2(w)}{N(w)} = \log a + k\log w.$$

A simple linear regression can thus be used to estimate a (intercept) and k (slope) using the initial portion of data (e.g., 7 days)

$$\frac{CV^2(1/7)}{N(1/7)}, \frac{CV^2(2/7)}{N(2/7)}, \ldots, \frac{CV^2(1)}{N(1)},$$

and obtain that $$\hat{k} = \frac{SS_{xy}}{SS_{xx}} = \frac{\sum_{i=1}^{7}\log\frac{i}{7}\log\frac{CV^2(i/7)}{N(i/7)} - \left(\sum_{i=1}^{7}\log\frac{i}{7}\right)\left(\sum_{i=1}^{7}\log\frac{CV^2(i/7)}{N(i/7)}\right)/7}{\sum_{i=1}^{7}\left(\log\frac{i}{7}\right)^2 - \left(\sum_{i=1}^{7}\log\frac{i}{7}\right)^2/7}\quad [8]$$

$$\hat{a} = \exp(\bar{y} - \hat{k}\bar{x}) = \exp\left\{\left(\sum_{i=1}^{7}\log\frac{CV^2(i/7)}{N(i/7)}\right)/7 - \hat{k}\left(\sum_{i=1}^{7}\log\frac{i}{7}\right)/7\right\}\quad [9]$$

In configurations, a simpler but less robust estimator of a and k can be derived using only two days of metrics 130 from the first week. For example, using $$\frac{CV^2(1/7)}{N(1/7)}$$

and $$\frac{CV^2(1)}{N(1)}$$

it can be determined that $$\hat{a} = \frac{CV^2(1)}{N(1)}\quad [10]$$

$$\hat{k} = \frac{\log\frac{CV^2(1/7)}{N(1/7)} - \log\frac{CV^2(1)}{N(1)}}{\log\frac{1}{7}} \quad [11]$$

Then, the power equation becomes $$\delta^2 = (1.96+0.845)^2(a_C w^{kC} + a_T w^{kT}(1+\delta)^2) \quad [12]$$

Since there is no analytic solution for w from the above equation [12], a table may be constructed for w for any given δ. For example, if it is desired to estimate the schedule/run length for an experiment 114 with a lift size (where lift size refers to a detectable difference between the control group and treatment group) of 0.5%, the smallest w should be determined such that $$(1.96+0.845)^2(a_C w^{kC} + a_T w^{kT}(1+0.005)^2) > 0.005^2 \quad [13]$$

Thus, if for w=1, 2, 3, 4, the inequality of equation [13] does not hold, the experiment 114 will not have enough power within four weeks of total runtime (e.g., an additional runtime of three weeks when the initial runtime for the experiment 114 is one week). In configurations, the lift size is in a range of 0.5% to 1.0%, although other lift sizes may be used if desired based upon the experiment 114. Additionally, in configurations the power is in a range of 75% to 85%, although other powers may be used if desired based upon the experiment 114.

In configurations, the data validity determination service 128 evaluates a misallocation margin for the random split among users triggering into an experiment 114 by using a threshold of 0.01 for a p value of a chi-square test to determine whether an alarm (e.g., some type of notification) or a flag with the data (e.g., data from the experiment is flagged as being invalid) should be provided to a user requesting experiment 114. The misallocation margin generally refers to a margin of error with respect to the random split among users triggering into an experiment 114. Generally, such an alarm or flag is provided when random assignment of users to the control group 116 and the treatment group 118 is not in line with the desired split within an acceptable margin, e.g., 50/50, although other splits may be used depending upon the experiment 114 and/or the user requesting the experiment 114 to be run.

In an ideal scenario where randomization works as desired, 1% of experiments 114 should be observed as receiving an alarm or flag. However, it has been observed that 7-9% of the experiments 114 trigger such an alarm or flag due to trigger code issues, system bugs and other unknown reasons. Proceeding with analysis of data from an experiment 114 by ignoring the alarm or flag may cause biased results and incorrect decisions. However when sample size for the experiment 114 becomes sufficiently large, a tiny deviation of the observed allocation from the expected allocation may falsely trigger the alarm or flag.

Accordingly, in configurations, a minimal detectable difference of the allocation δ with a false positive rate of 1% (α=0.01) and a false negative rate of 1% or 99% power (δ=0.01) is computed by the data validity determination service 128 with equation [14] below:

$$\delta = \left(Z_{1-\frac{\alpha}{2}} + Z_{1-\beta}\right)\sqrt{\frac{p_C p_T}{N_C + N_T}} \quad [14]$$

where $p_c$ and $p_T$ are the expected proportions of users assigned to the control group 118 and treatment group 116, respectively, and $N_C$ and $N_T$ are the actual number of users assigned to the control group 118 and treatment group 116, respectively. Z is defined as the quantile of normal distribution for a chi-square distribution having degrees of freedom corresponding to the number of treatment groups, which in this example is one. δ is defined to be the misallocation margin threshold. Then, in configurations, for the following conditions:

if the difference of the observed proportions is:

$$\left|\hat{p}_C - \frac{p_c}{p_c + p_T}\right| < \delta,$$

then no alarm or flag is provided and the data from the experiment may be considered valid; and if the difference of the observed proportions $$\left|\hat{p}_C - \frac{p_c}{p_c + p_T}\right| \geq \delta,$$

then an alarm or flag may be provided and the data from the experiment may be considered invalid due to some problem such as, for example, due to trigger code issues, system bugs, and other unknown reasons, e.g., the users triggering into the experiment were not properly randomly assigned among the treatment group 116 and the control group 118.

In configurations, multiple experiments 114 may be run simultaneously. In such configurations, multiple treatment groups 116 may be defined along with a single control group 118. For example, there may be three treatment groups for three experiments 114 and one control group. The desired split may thus be, for example, 25% of users for each treatment group and 25% for the control group, although other splits may be used. In configurations with multiple experiments, the power for each experiment is computed with a false positive rate of 1% (α=0.01), although other rates may be used if desired. The experiments are assumed to have n treatment groups: C ($T_0$), $T_1$, ..., $T_n$. The effective size s is computed as $$s = \sqrt{\sum_{i=0}^{n}\frac{(\hat{p}_i - p_i)^2}{p_i}} \quad [15]$$

where $\hat{p}_i$ and $p_i$ are the observed and expected allocation of users to the corresponding treatment group (i.e. proportion of the experiment count) for $T_i$ respectively. The power β may be computed as $$\beta = 1 - pchisq(q=qchisq(1-\alpha,n), df=n, ncp=Ns^2)) \quad [16]$$

where N is the total number of users triggered into the experiments, pchisq and qchisq are the distribution function and quantile function of a chi-square distribution with df degree of freedoms (e.g., number of treatments/experiments) and non-centrality parameter ncp. Then, in configurations, for the following conditions:

if β<99%, then no alarm or flag is provided and the data from the experiments may be considered valid; and if β≥99%, then an alarm or flag may be provided and the data from the experiment may be considered invalid due to some problem such as, for example, trigger code issues, system bugs, and other unknown reasons, e.g., the users triggering into the experiments were not properly randomly assigned among the treatment groups s and the control group.

Figure 3:
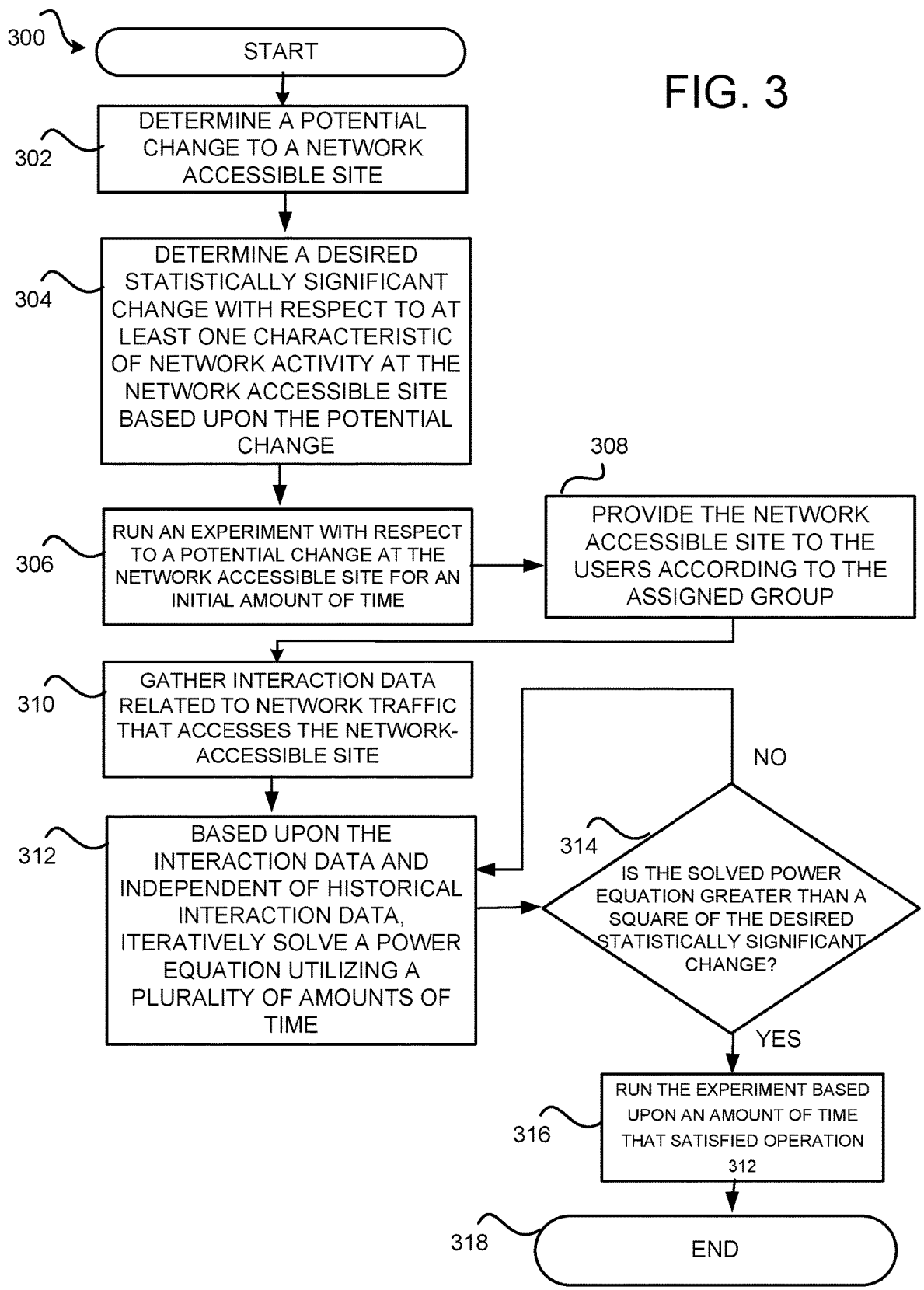
FIG. 3 is a flow diagram showing a routine that illustrates aspects of determining an experiment length runtime by an experiment length determination service of the arrangements of FIGS. 1 and 2.

FIG. 3 includes a flow diagram showing a routine 300 that illustrates aspects of determining an experiment length runtime by an experiment length determination service, e.g. the experiment length determination service 122 of the distributed computing network 100 of FIGS. 1 and 2, to determine an amount of time to run an experiment based upon initial data and without using historical data.

It is to be appreciated that the logical operations described herein with respect to FIG. 3 (and the other FIGS.) can be implemented (1) as a sequence of computer implemented acts or program modules running on a computing system and/or (2) as interconnected machine logic circuits or circuit modules within the computing system. The implementation of the various components described herein is a matter of choice dependent on the performance and other requirements of the computing system. Accordingly, the logical operations described herein are referred to variously as operations, structural devices, acts, or modules.

These operations, structural devices, acts, and modules can be implemented in software, in firmware, in special purpose digital logic, and any combination thereof. It should also be appreciated that more or fewer operations can be performed than shown in the FIGS. and described herein. These operations can also be performed in parallel, or in a different order than those described herein.

The routine 300 begins at operation 302, where a potential change to a network accessible site, e.g., website 108 provided by website service 102 of the distributed computing network 100, is determined. At operation 304, a desired statistically significant change with respect to at least one characteristic of network activity at the network accessible site based upon the potential change is determined.

At operation 306, an experiment, e.g., experiment 114, is run at the network accessible site for an initial amount of time. In configurations, running the experiment includes randomly directing network traffic at the network accessible site into one of (i) a control group, e.g., control group 118, where the potential change is not made to the network accessible site or (ii) a treatment group, e.g., treatment group 116, where the potential change is made to the network accessible site. At operation 308, the network accessible site is provided to the users 104 according to the assigned group. At operation 310, interaction data is gathered and is related to the network traffic that accesses the network accessible site related to the at least one characteristic of behavior of the network traffic at the network accessible site during the initial amount of time.

From operation 310, the routine 300 continues to operation 312, where based upon the interaction data and independent of historical interaction data, a power equation, e.g., equation [12], is iteratively solved utilizing a plurality of amounts of time.

At operation 314, it is determined if the solved power equation is greater than a square of the desired statistically significant change. If so, then the routine 300 proceeds to operation 316, where the experiment is run for an amount of time that satisfied operation 312. In configurations, the amount of time is a minimal amount of time that satisfied operation 312. From operation 316, the routine proceeds to operation 318, where it ends. If not, then the routine 300 proceeds back to operation 312 and continues to iteratively solve the power equation.

Figure 4:
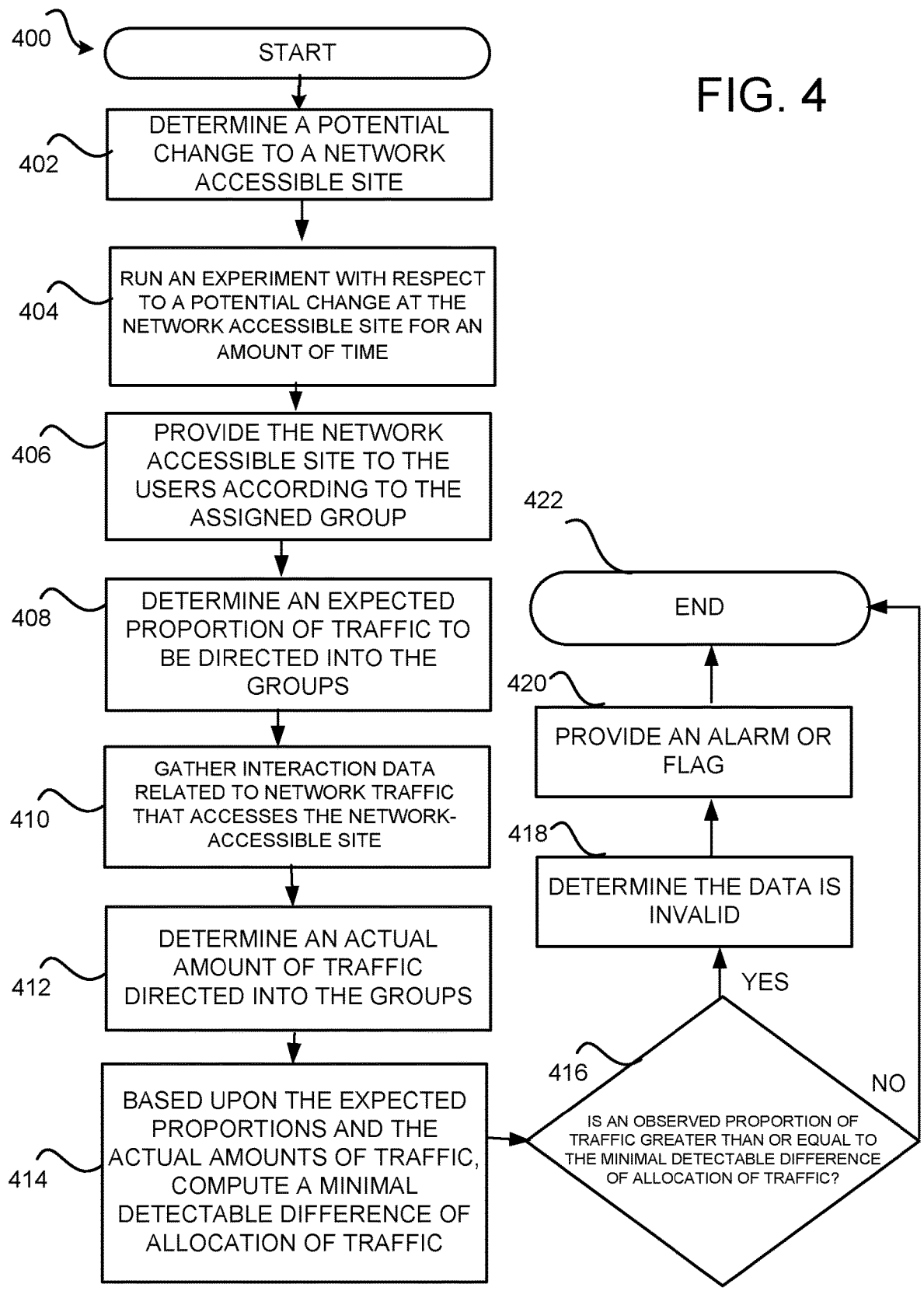
FIG. 4 is a flow diagram showing a routine that illustrates aspects of determining validity of data by a data validity service of the arrangements of FIGS. 1 and 2.

FIG. 4 includes a flow diagram showing a routine 400 that illustrates aspects of determining validity of data by a data validity service, e.g. the data validity determination service 128 of the distributed computing network 100 of FIGS. 1 and 2. The routine 400 begins at operation 402, where a potential change to a network accessible site, e.g., website 108 provided by website service 102 of the distributed computing network 100, is determined.

At operation 404, an experiment, e.g., experiment 114, is run at the network accessible site for an amount of time. In configurations, running the experiment includes randomly directing network traffic at the network accessible site into one of (i) a control group, e.g., control group 118, where the potential change is not made to the network accessible site or (ii) a treatment group, e.g., treatment group 116, where the potential change is made to the network accessible site. At operation 406, the network accessible site is provided to the users 104 according to the assigned group.

At operation 408, an expected proportion of traffic to be directed into each of the control group and the treatment group is determined. At operation 410, interaction data related to the use of the network accessible site is gathered.

From operation 410, the routine 400 continues to operation 412, where an actual amount of traffic directed into each of the control group and the treatment group is determined. At operation 414, based upon the expected proportions and the actual amounts of traffic, a minimal detectable difference of allocation of traffic is computed using, for example, equation [14].

At operation 416, it is determined if an observed proportion of network traffic is greater than or equal to the minimal detectable difference of allocation of network traffic. If so, then the routine 400 proceeds to operation 418, where it is determined that the data is invalid. From operation 418, the routine 400 proceeds to operation 420, where an alarm or flag is provided. From operation 420, the routine 400 proceeds to operation 422, where it ends. If the data is not determined to be invalid, then the routine 400 proceeds to operation 422 since the data is deemed to be valid.

Figure 5:
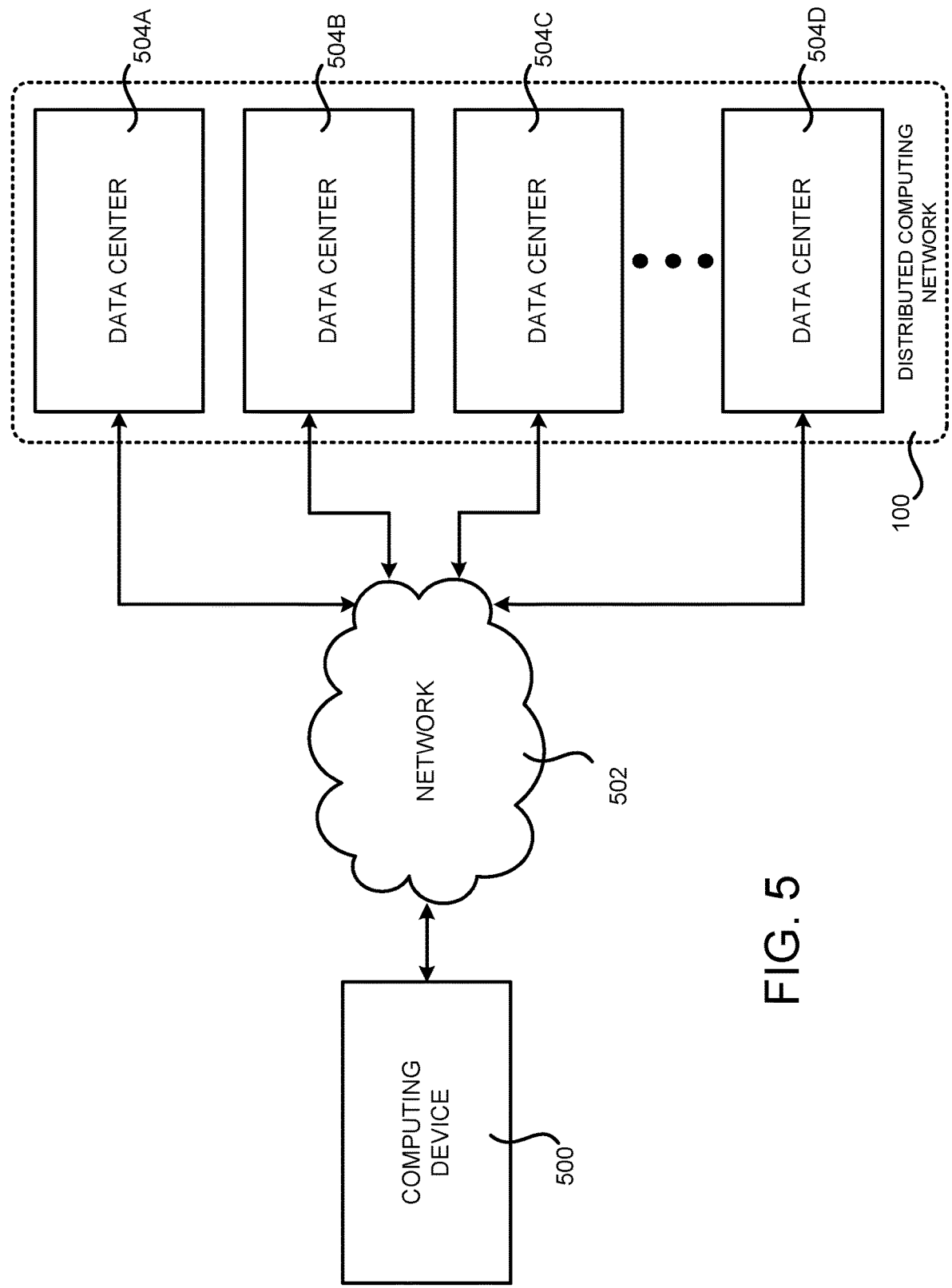
FIG. 5 is a system and network diagram that shows an illustrative operating environment that includes a distributed computing network that can be configured to implement aspects of the functionality described herein.

FIG. 5 is a system and network diagram that shows one illustrative operating environment for the configurations disclosed herein that includes a distributed computing network 100. As discussed above, the distributed computing network 100 can execute network services that provide computing resources on a permanent or an as-needed basis. Among other types of functionality, the computing resources provided by the distributed computing network 100 can be utilized to implement the various network services described herein. As also discussed above, the computing resources provided by the distributed computing network 100 can include various types of computing resources, such as data processing resources like VM instances, stateless event-driven compute services, data storage resources, networking resources, data communication resources, network services, and the like.

Each type of computing resource provided by the distributed computing network 100 can be general-purpose or can be available in a number of specific configurations. For example, data processing resources can be available as physical computers or VM instances in a number of different configurations. The VM instances can be configured to execute applications, including Web servers, application servers, media servers, database servers, some or all of the network services described above, and/or other types of programs. Data storage resources can include file storage devices, block storage devices, and the like. The distributed computing network 100 can also be configured to provide other types of computing resources not mentioned specifically herein.

As also discussed above, the computing resources provided by the distributed computing network 100 are enabled in one implementation by one or more data centers 504A-504D (which might be referred herein singularly as "a data center 504" or in the plural as "the data centers 504"). The data centers 504 are facilities utilized to house and operate computer systems and associated components. The data centers 504 typically include redundant and backup power, communications, cooling, and security systems. The data centers 504 can also be located in geographically disparate locations. One illustrative configuration for a data center 504 that can be utilized to implement the technologies disclosed herein will be described below with regard to FIG. 6.

The users of the distributed computing network 100 can access the computing resources provided by the distributed computing network 100 over a network 502, which can be a wide area communication network (WAN), such as the Internet, an intranet or an Internet service provider (ISP) network or a combination of such networks. For example, and without limitation, a computing device 500 operated by a user of the distributed computing network 100 can be utilized to access the distributed computing network 100 by way of the network 502. It should be appreciated that a local-area network (LAN), the Internet, or any other networking topology known in the art that connects the data centers 504 to remote users and other users can be utilized. It should also be appreciated that combinations of such networks can also be utilized.

Figure 6:
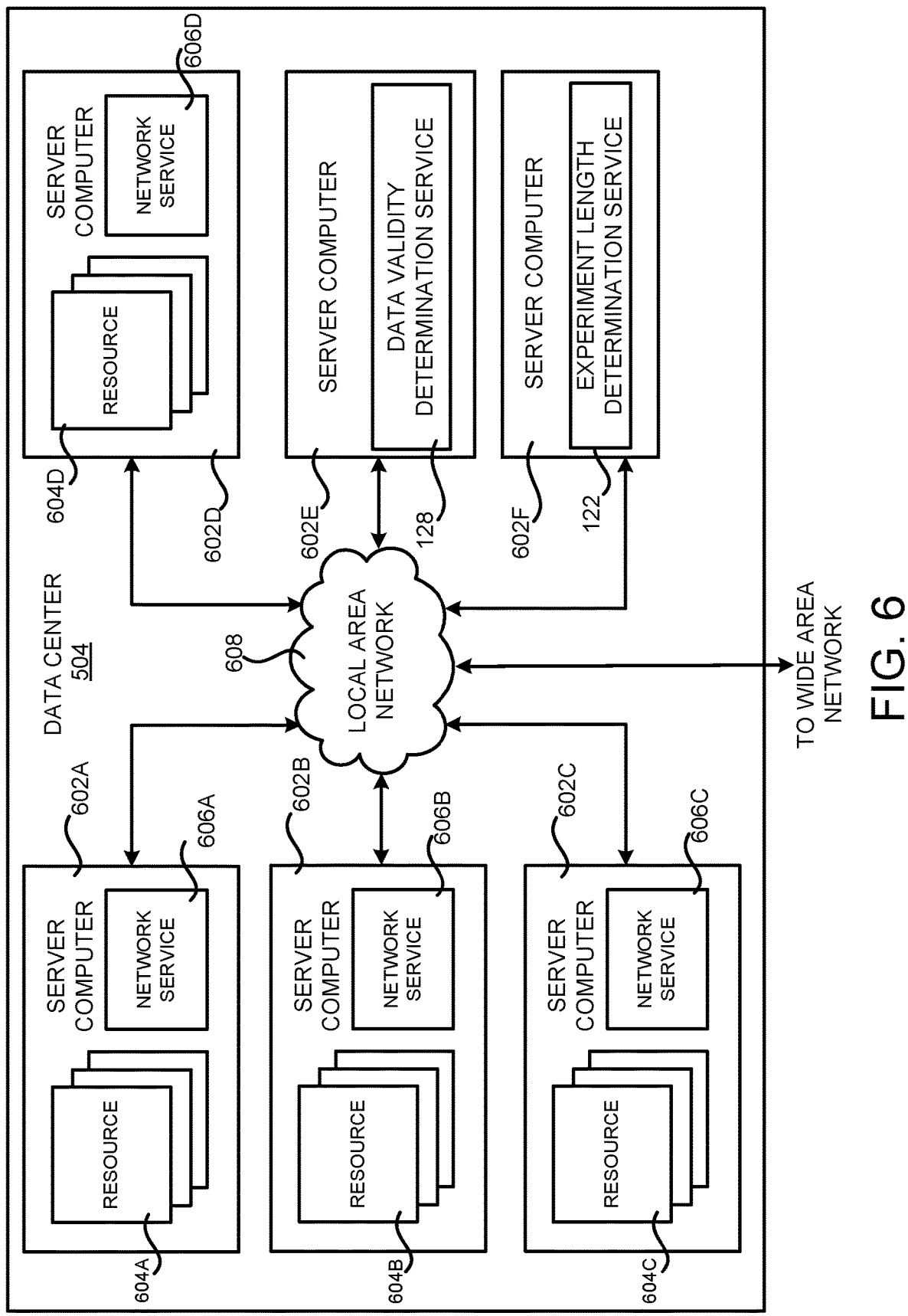
FIG. 6 is a computing system diagram illustrating a configuration for a data center that can be utilized to implement aspects of the technologies disclosed herein.

FIG. 6 is a computing system diagram that illustrates one configuration for a data center 504 that implements aspects of the technologies disclosed herein. The example data center 504 shown in FIG. 6 includes several server computers 602A-602F (which might be referred to herein singularly as "a server computer 602" or in the plural as "the server computers 602") for providing the computing resources 604A-604D.

The server computers 602 can be standard tower, rackmount, or blade server computers configured appropriately for providing the computing resources 604 described herein (illustrated in FIG. 6 as the computing resources 604A-604D). As mentioned above, the computing resources 604 provided by the distributed computing network 100 can be data processing resources such as VM instances or hardware computing systems, data storage resources, database resources, networking resources, and others. Some of the servers 602 can also be configured to execute network services 606A-606D, respectively, capable of instantiating, providing and/or managing the computing resources 604.

The data center 504 shown in FIG. 6 also includes a server computer 602F that can execute some or all of the software components described above. For example, and without limitation, the server computer 602E can be configured to execute the data validity determination service 128, which was described in detail above. Additionally, for example, and without limitation, the server computer 602F can be configured to execute the experiment length determination service 122, which was described in detail above. Also, only one server 602E or 602F may be configured to execute both the experiment length determination service 122 and the data validity determination service 128. In this regard, it should be appreciated that the software components can execute on many other physical or virtual servers in the data centers 504 in various configurations.

In the example data center 504 shown in FIG. 6, an appropriate LAN 608 is also utilized to interconnect the server computers 602A-602F. The LAN 608 is also connected to the network 502 illustrated in FIG. 5. It should be appreciated that the configuration of the network topology described herein has been greatly simplified and that many more computing systems, software components, networks, and networking devices can be utilized to interconnect the various computing systems disclosed herein and to provide the functionality described above.

Appropriate load balancing devices or other types of network infrastructure components can also be utilized for balancing a load between each of the data centers 504A-504D, between each of the server computers 602A-602F in each data center 504, and, potentially, between computing resources 604 in each of the data centers 504. It should be appreciated that the configuration of the data center 504 described with reference to FIG. 6 is merely illustrative and that other implementations can be utilized.

Figure 7:
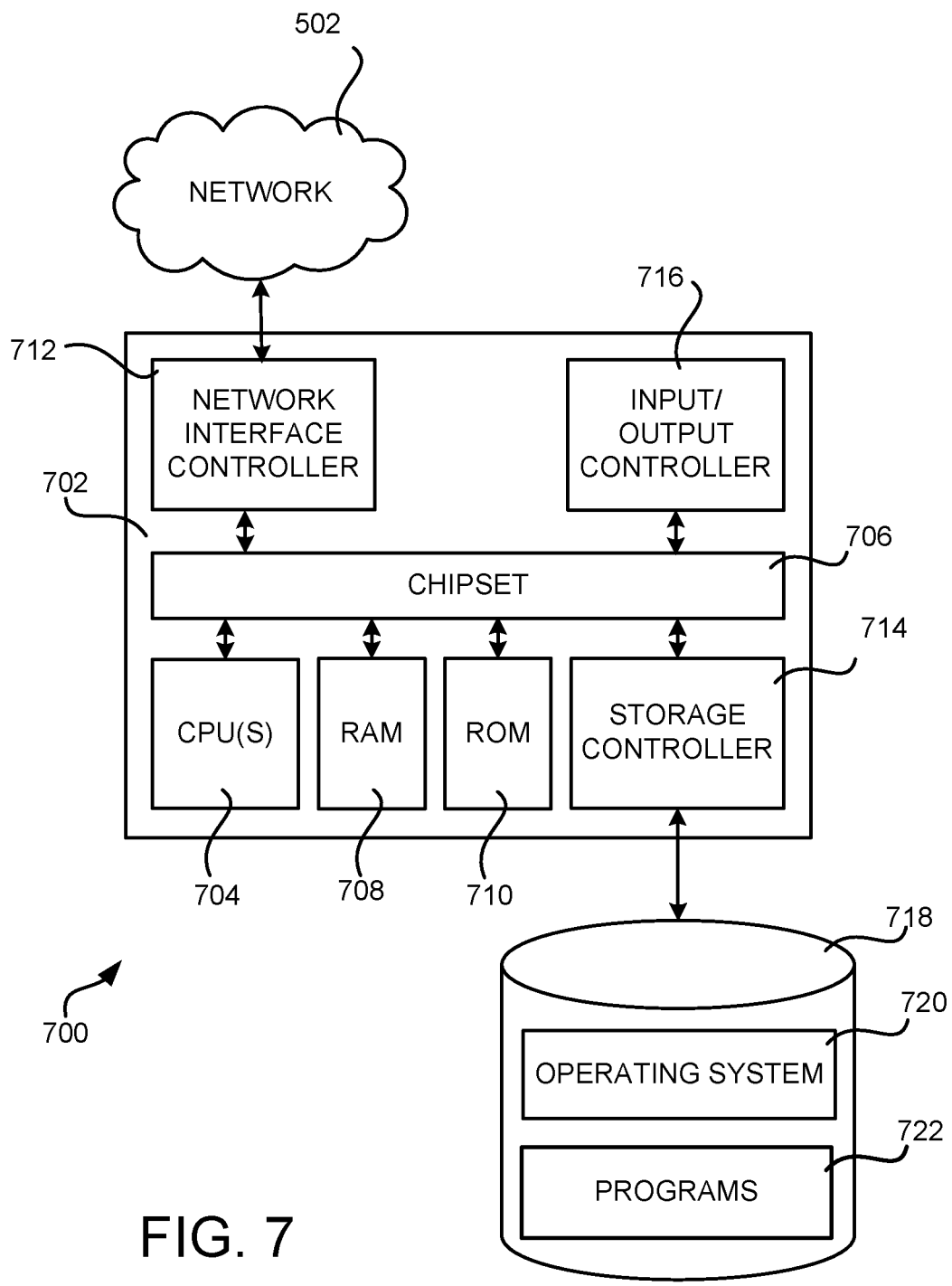
FIG. 7 is a computer architecture diagram showing an illustrative computer hardware architecture for implementing a computing device that can be utilized to implement aspects of the various technologies presented herein.

FIG. 7 shows an example computer architecture for a computer 700 capable of executing program components for implementing the functionality described above. The computer architecture shown in FIG. 7 illustrates a conventional server computer, workstation, desktop computer, laptop, tablet, network appliance, e-reader, smartphone, or other computing device, and can be utilized to execute any of the software components presented herein.

The computer 700 includes a baseboard 702, or "motherboard," which is a printed circuit board to which a multitude of components or devices can be connected by way of a system bus or other electrical communication paths. In one illustrative configuration, one or more central processing units ("CPUs") 704 operate in conjunction with a chipset 706. The CPUs 704 can be standard programmable processors that perform arithmetic and logical operations necessary for the operation of the computer 700.

The CPUs 704 perform operations by transitioning from one discrete, physical state to the next through the manipulation of switching elements that differentiate between and change these states. Switching elements can generally include electronic circuits that maintain one of two binary states, such as flip-flops, and electronic circuits that provide an output state based on the logical combination of the states of one or more other switching elements, such as logic gates. These basic switching elements can be combined to create more complex logic circuits, including registers, adders-subtractors, arithmetic logic units, floating-point units, and the like.

The chipset 706 provides an interface between the CPUs 704 and the remainder of the components and devices on the baseboard 702. The chipset 706 can provide an interface to a RAM 708, used as the main memory in the computer 700. The chipset 706 can further provide an interface to a computer-readable storage medium such as a read-only memory ("ROM") 710 or non-volatile RAM ("NVRAM") for storing basic routines that help to startup the computer 700 and to transfer information between the various components and devices. The ROM 710 or NVRAM can also store other software components necessary for the operation of the computer 700 in accordance with the configurations described herein.

The computer 700 can operate in a networked environment using logical connections to remote computing devices and computer systems through a network, such as the network 702 shown in FIG. 7. The chipset 706 can include functionality for providing network connectivity through a NIC 712, such as a gigabit Ethernet adapter. The NIC 712 is capable of connecting the computer 700 to other computing devices over the network 708. It should be appreciated that multiple NICs 712 can be present in the computer 700, connecting the computer to other types of networks and remote computer systems.

The computer 700 can be connected to a mass storage device 718 that provides non-volatile storage for the computer. The mass storage device 718 can store an operating system 720, programs 722, and data, which have been described in greater detail herein. The mass storage device 718 can be connected to the computer 700 through a storage controller 714 connected to the chipset 706. The mass storage device 718 can consist of one or more physical storage units. The storage controller 714 can interface with the physical storage units through a serial attached SCSI ("SAS") interface, a serial advanced technology attachment ("SATA") interface, a fiber channel ("FC") interface, or other type of interface for physically connecting and transferring data between computers and physical storage units.

The computer 700 can store data on the mass storage device 718 by transforming the physical state of the physical storage units to reflect the information being stored. The specific transformation of physical state can depend on various factors, in different implementations of this description. Examples of such factors can include, but are not limited to, the technology used to implement the physical storage units, whether the mass storage device 718 is characterized as primary or secondary storage, and the like.

For example, the computer 700 can store information to the mass storage device 718 by issuing instructions through the storage controller 714 to alter the magnetic characteristics of a particular location within a magnetic disk drive unit, the reflective or refractive characteristics of a particular location in an optical storage unit, or the electrical characteristics of a particular capacitor, transistor, or other discrete component in a solid-state storage unit. Other transformations of physical media are possible without departing from the scope and spirit of the present description, with the foregoing examples provided only to facilitate this description. The computer 700 can further read information from the mass storage device 718 by detecting the physical states or characteristics of one or more particular locations within the physical storage units.

In addition to the mass storage device 718 described above, the computer 700 can have access to other computer-readable storage media to store and retrieve information, such as program modules, data structures, or other data. It should be appreciated by those skilled in the art that computer-readable storage media is any available media that provides for the non-transitory storage of data and that can be accessed by the computer 700.

By way of example, and not limitation, computer-readable storage media can include volatile and non-volatile, removable and non-removable media implemented in any method or technology. Computer-readable storage media includes, but is not limited to, RAM, ROM, erasable programmable ROM ("EPROM"), electrically-erasable programmable ROM ("EEPROM"), flash memory or other solid-state memory technology, compact disc ROM ("CD-ROM"), digital versatile disk ("DVD"), high definition DVD ("HD-DVD"), BLU-RAY, or other optical storage, magnetic cassettes, magnetic tape, magnetic disk storage or other magnetic storage devices, or any other medium that can be used to store the desired information in a non-transitory fashion.

As mentioned briefly above, the mass storage device 718 can store an operating system 720 utilized to control the operation of the computer 700. According to one configuration, the operating system comprises the LINUX operating system. According to another configuration, the operating system comprises the WINDOWS® SERVER operating system from MICROSOFT Corporation. According to further configurations, the operating system can comprise the UNIX operating system or one of its variants. It should be appreciated that other operating systems can also be utilized. The mass storage device 718 can store other system or application programs and data utilized by the computer 700.

In one configuration, the mass storage device 718 or other computer-readable storage media is encoded with computer-executable instructions which, when loaded into the computer 700, transform the computer from a general-purpose computing system into a special-purpose computer capable of implementing the configurations described herein. These computer-executable instructions transform the computer 700 by specifying how the CPUs 704 transition between states, as described above. According to one configuration, the computer 700 has access to computer-readable storage media storing computer-executable instructions which, when executed by the computer 700, perform the various processes described above with regard to FIGS. 1-4. The computer 700 can also include computer-readable storage media for performing any of the other computer-implemented operations described herein.

The computer 700 can also include one or more input/output controllers 716 for receiving and processing input from a number of input devices, such as a keyboard, a mouse, a touchpad, a touch screen, an electronic stylus, or other type of input device. Similarly, an input/output controller 716 can provide output to a display, such as a computer monitor, a flat-panel display, a digital projector, a printer, or another type of output device. It will be appreciated that the computer 700 might not include all of the components shown in FIG. 7, can include other components that are not explicitly shown in FIG. 7, or might utilize an architecture completely different than that shown in FIG. 7.

Based on the foregoing, it should be appreciated that technologies for determining a runtime length for experiments run at a network accessible site and for determining the validity of data collected by the experiments have been presented herein. Additionally, based on the foregoing, it should be appreciated that technologies for determining validity of data gathered during experiments run at a network accessible site operating within a distributed computing network have also been presented herein. Moreover, although the subject matter presented herein has been described in language specific to computer structural features, methodological acts, and computer readable media, it is to be understood that the invention defined in the appended claims is not necessarily limited to the specific features, acts, or media described herein. Rather, the specific features, acts, and mediums are disclosed as example forms of implementing the claims.

The subject matter described above is provided by way of illustration only and should not be construed as limiting. Furthermore, the claimed subject matter is not limited to implementations that solve any or all disadvantages noted in any part of this disclosure. Various modifications and changes can be made to the subject matter described herein without following the example configurations and applications illustrated and described, and without departing from the true spirit and scope of the present invention, which is set forth in the following claims.

What is claimed is:

1. A computer-implemented method for determining validity of data gathered from an experiment related network accessible content changes, the method comprising:
    determining a potential change to a network accessible site;
    running an experiment on network traffic at the network accessible site for an amount of time, wherein running the experiment on the network traffic comprises (i) randomly directing a first amount of the network traffic at the network accessible site into a control group where the potential change is not made to the network accessible site and (ii) randomly directing a second amount of the network traffic at the network accessible site into a treatment group where the potential change is made to the network accessible site;
    determining a first expected proportion of the network traffic to be randomly directed into the control group;
    determining a second expected proportion of the network traffic to be randomly directed into the treatment group;
    gathering interaction data related to the network traffic accessing the network accessible site, the interaction data related to at least one characteristic of behavior of the network traffic at the network accessible site during the amount of time;
    determining a first actual amount of the network traffic directed into the control group;
    determining a second actual amount of the network traffic directed into the treatment group;
    based upon the (i) first expected proportion of the network traffic to be randomly directed into the control group, the (ii) second expected proportion of the network traffic to be randomly directed into the treatment group, the (iii) first actual amount of the network traffic directed into the control group, and the (iv) second actual amount of the network traffic directed into the treatment group, computing a misallocation margin threshold for allocation of the network traffic between the control group and the treatment group;
    identifying an absolute value of an observed proportion of the network traffic directed to the control group to be greater than or equal to the misallocation margin threshold for the allocation of the network traffic; and
    determining that the interaction data is invalid.

2. The computer-implemented method of claim 1, further comprising:
    based at least in part on determining that the interaction data is invalid, providing an alarm indicating that the interaction data is invalid.

3. The computer-implemented method of claim 1, further comprising:
    based at least in part on determining that the interaction data is invalid, providing a flag with the interaction data indicating that the interaction data is invalid.

4. The computer-implemented method of claim 1, further comprising:
    running multiple experiments and directing the network traffic into multiple treatment groups;
    wherein computing a misallocation margin threshold for the allocation of the network traffic comprises computing a power based, at least in part, on a chi-square distribution with a degree of freedom corresponding to the multiple treatment groups; and
    wherein if the power is greater than or equal to 99%, then the data is invalid.

5. The computer-implemented method of claim 4, wherein the power is computed based upon a false positive rate of 1%.

6. The computer-implemented method of claim 1, wherein randomly directing the network traffic at the network accessible site into one of the control group and the treatment group comprises directing the network traffic at the network accessible site into one of the control group and the treatment group such that approximately 50% of the network traffic is directed into the control group and approximately 50% of the network traffic is directed into the treatment group.

7. A system comprising:
    one or more processors; and
    at least one computer-readable storage medium having computer-executable instructions stored thereupon which, when executed by the one or more processors, cause the system to:
    run an experiment with users related to a potential change at a network accessible site for an amount of time, wherein running the experiment with the users comprises (i) randomly directing a first amount of the users of the network accessible site into a control group where the potential change is not made to the network accessible site and (ii) randomly directing a second amount of the users of the network accessible site into a treatment group where the potential change is made to the network accessible site;
    based upon (i) expected metrics related to an expected allocation of the users between the control group and the treatment group from the randomly directing the first amount of the users of the network accessible site into the control group and the randomly directing the second amount of the users of the network accessible site into the treatment group and (ii) actual metrics related to an actual allocation of the users between the control group and the treatment group, determine that an allowed error has been exceeded by an observed proportion of the users directed to the control group; and
    determine that data obtained from the experiment is invalid.

8. The system of claim 7, wherein the computer-executable instructions, when executed by the one or more processors, further cause the system to determine if the allowed error has been exceeded by:
    computing a misallocation margin threshold for allocation of the users; and
    wherein determine that data obtained from the experiment is invalid comprises determining that an absolute value of the observed proportion of the users directed to the control group is greater than or equal to the misallocation margin threshold for allocation of the users.

9. The system of claim 7, wherein the computer-executable instructions, when executed by the one or more processors, further cause the system to:
    based at least in part on determining that the data obtained from the experiment is invalid, provide an alarm indicating that the data is invalid.

10. The system of claim 9, wherein the computer-executable instructions, when executed by the one or more processors, further cause the system to:
    based at least in part on determining that the data obtained from the experiment is invalid, provide a flag with the data indicating that the data is invalid.

11. The system of claim 8, wherein the computer-executable instructions, when executed by the one or more processors, further cause the system to:
- run multiple experiments and directing the users into multiple treatment groups;
- wherein compute a misallocation margin threshold for allocation of the users comprises computing a power based on a chi-square distribution with a degree of freedoms corresponding to the multiple treatment groups; and
- wherein determine that data obtained from the experiment is invalid comprises determining that the power is greater than or equal to 99%.

12. The system of claim 11, wherein the power is computed based upon a false positive rate of 1%.

13. The system of claim 7, wherein directing the users at the network accessible site into one of the control group and the treatment group comprises directing network traffic at the network accessible site into one of the control group and the treatment group such that approximately 50% of the users are directed into the control group and approximately 50% of the users are directed into the treatment group.

14. A computer-readable storage medium having computer-executable instructions stored thereupon which, when executed by one or more processors, cause the one or more processors to:
- run an experiment with users related to a potential change at the network accessible site for an amount of time, wherein running the experiment with the users comprises randomly directing a first amount of the users at the network accessible site into a control group where the potential change is not made to the network accessible site and (ii) randomly directing a second amount of the users of the network accessible site into a treatment group where the potential change is made to the network accessible site;
- based upon (i) expected metrics related to an expected allocation of the users between the control group and the treatment group from the randomly directing the first amount of the users of the network accessible site into the control group and randomly directing the second amount of the users of the network accessible site into the treatment group and (ii) actual metrics related to an actual allocation of the users between the control group and the treatment group, determine that an allowed error has been exceeded by an observed proportion of the users directed to the control group; and
- determine that data obtained from the experiment is invalid.

15. The computer-readable storage medium of claim 14, wherein the computer-executable instructions, when executed by the one or more processors, further cause the processors to determine if the allowed error has been exceeded by:
- computing a detectable difference of allocation of the users; and
- wherein determine that data obtained from the experiment is invalid comprises determining that an absolute value of the observed proportion of the users directed to the control group is greater than or equal to the detectable difference of allocation of the users.

16. The computer-readable storage medium of claim 14, wherein the computer-executable instructions, when executed by the one or more processors, further cause the processors to:
- based at least in part on determining that the data obtained from the experiment is invalid, provide an alarm indicating that the data is invalid.

17. The computer-readable storage medium of claim 16, wherein the computer-executable instructions, when executed by the one or more processors, further cause the processors to:
- based at least in part on determining that the data obtained from the experiment is invalid, provide a flag with the data indicating that the data is invalid.

18. The computer-readable storage medium of claim 14, wherein the computer-executable instructions, when executed by the one or more processors, further cause the processors to:
- run multiple experiments and directing the users into multiple treatment groups; and
- wherein computing a detectable difference of allocation of the users comprises computing a power based on a chi-square distribution with a degree of freedoms corresponding to the multiple treatment groups; and
- wherein determine that data obtained from the experiment is invalid comprises determining that the power is greater than or equal to 99%.

19. The computer-readable storage medium of claim 18, wherein the power is computed based upon a false positive rate of 1%.

20. The computer-readable storage medium of claim 14, wherein directing the users at the network accessible site into one of the control group and the treatment group comprises directing network traffic at the network accessible site into one of the control group and the treatment group such that approximately 50% of the users are directed into the control group and approximately 50% of the users are directed into the treatment group.

* * * * *